United States Patent
Nakayama

(10) Patent No.: US 11,897,343 B2
(45) Date of Patent: Feb. 13, 2024

(54) EARTH LEAKAGE DETECTING DEVICE, AND VEHICULAR POWER SUPPLY SYSTEM

(71) Applicant: SANYO Electric Co., Ltd., Osaka (JP)

(72) Inventor: Masato Nakayama, Hyogo (JP)

(73) Assignee: SANYO Electric Co., Ltd., Osaka (JP)

( * ) Notice: Subject to any disclaimer, the term of this patent is extended or adjusted under 35 U.S.C. 154(b) by 93 days.

(21) Appl. No.: 17/621,183

(22) PCT Filed: Jun. 15, 2020

(86) PCT No.: PCT/JP2020/023446
§ 371 (c)(1),
(2) Date: Dec. 20, 2021

(87) PCT Pub. No.: WO2020/262082
PCT Pub. Date: Dec. 30, 2020

(65) Prior Publication Data
US 2022/0355669 A1 Nov. 10, 2022

(30) Foreign Application Priority Data
Jun. 28, 2019 (JP) .................. 2019-121503

(51) Int. Cl.
*B60L 3/00* (2019.01)
(52) U.S. Cl.
CPC ........... *B60L 3/0069* (2013.01); *B60L 3/0046* (2013.01)
(58) Field of Classification Search
CPC .................. B60L 3/0069; B60L 3/0046
See application file for complete search history.

(56) References Cited

U.S. PATENT DOCUMENTS

| 2007/0188948 A1* | 8/2007 | Morita ................ B60L 58/10 361/42 |
| 2014/0035594 A1 | 2/2014 | Kamata et al. |
| 2018/0224493 A1* | 8/2018 | Kawamura .......... G01R 31/382 |

FOREIGN PATENT DOCUMENTS

| EP | 2698641 A2 | 2/2014 |
| JP | 2003-250201 | 9/2003 |

(Continued)

OTHER PUBLICATIONS

International Search Report of PCT application No. PCT/JP2020/023446 dated Sep. 1, 2020.
(Continued)

*Primary Examiner* — Jared Fureman
*Assistant Examiner* — Duc M Pham
(74) *Attorney, Agent, or Firm* — WHDA, LLP

(57) ABSTRACT

In earth leakage detection device, one end of coupling capacitor is connected to a current path of power storage unit connected to load in a state of being insulated from the ground. Voltage output unit generates a periodically changing periodic voltage, and applies the periodic voltage to the other end of coupling capacitor via first resistor. Second resistor and third resistor are connected in series between a node between coupling capacitor and first resistor and a predetermined fixed potential. Voltage measurement unit measures a voltage at a voltage dividing point between second resistor and third resistor. Earth leakage determination unit determines presence or absence of an earth leakage between the current path of power storage unit and the ground based on the measured voltage.

5 Claims, 8 Drawing Sheets

(56) References Cited

FOREIGN PATENT DOCUMENTS

| | | |
|---|---|---|
| JP | 2007-192674 | 8/2007 |
| JP | 2010-151595 | 7/2010 |

OTHER PUBLICATIONS

The Extended European Search Report dated Jul. 8, 2022 for the related European Patent Application No. EP20832356.8.

* cited by examiner (a)

(b)

EARTH LEAKAGE DETECTING DEVICE, AND VEHICULAR POWER SUPPLY SYSTEM

TECHNICAL FIELD

The present invention relates to an earth leakage detection device that detects an earth leakage from a load insulated from a ground, and a vehicular power supply system.

BACKGROUND ART

In recent years, hybrid vehicles (HVs), plug-in hybrid vehicles (PHVs), and electric vehicles (EVs) have become widespread. In these electrically operated vehicles, a high-voltage driving battery (traction battery) is mounted in addition to an auxiliary battery (generally, a lead battery having an output of 12 V). In order to prevent an electric shock, a power circuit which includes a high-voltage driving battery, an inverter, and a drive motor is insulated from a body (chassis ground) of a vehicle.

A Y capacitor is inserted between a positive wire of a power circuit on a vehicle side and a chassis ground, and a Y capacitor is inserted between a negative wire of the power circuit on the vehicle side and the chassis ground. Accordingly, electricity can be stably supplied from the high-voltage driving battery to a load on the vehicle side. An earth leakage detection device which detects an earth leakage by monitoring an insulation resistance between a power circuit and a chassis ground is mounted.

In an AC type earth leakage detection device, the presence or absence of an earth leakage is detected by applying a pulse voltage to a positive-electrode terminal or a negative-electrode terminal of a driving battery via a resistor and a coupling capacitor, and measuring a voltage at a node between the resistor and the coupling capacitor (see, for example, PTL 1).

CITATION LIST

Patent Literature

PTL 1: Unexamined Japanese Patent Publication No. 2003-250201

SUMMARY OF THE INVENTION

In the above configuration in the AC system, the voltage at the measurement point may deviate from the measurement range at the time of a sudden change in the earth leakage state such as opening and closing of a main relay (contactor) connected between the battery side and the vehicle side.

The present disclosure has been made in view of such a situation, and an object of the present disclosure is to provide a technique for shortening a period during which a voltage at a measurement point deviates from a measurement range in an earth leakage detection device.

In order to solve the above problem, an earth leakage detection device according to an aspect of the present disclosure includes: a coupling capacitor having one end connected to a current path of a power storage unit connected to a load in a state of being insulated from a ground; a voltage output unit that generates a periodically changing periodic voltage and applies the periodic voltage to another end of the coupling capacitor via a first resistor; a second resistor and a third resistor connected in series between a node between the coupling capacitor and the first resistor and a predetermined fixed potential; a voltage measurement unit that measures a voltage at a voltage dividing point between the second resistor and the third resistor; and an earth leakage determination unit that determines presence or absence of an earth leakage between the current path of the power storage unit and the ground based on the voltage measured by the voltage measurement unit.

According to the present disclosure, in the earth leakage detection device, it is possible to shorten a period during which the voltage at the measurement point deviates from the measurement range.

BRIEF DESCRIPTION OF DRAWINGS

FIG. 4 is a diagram illustrating an example of a measured voltage waveform when a main relay is turned on.

DESCRIPTION OF EMBODIMENTS

Comparative Example

Figure 1:
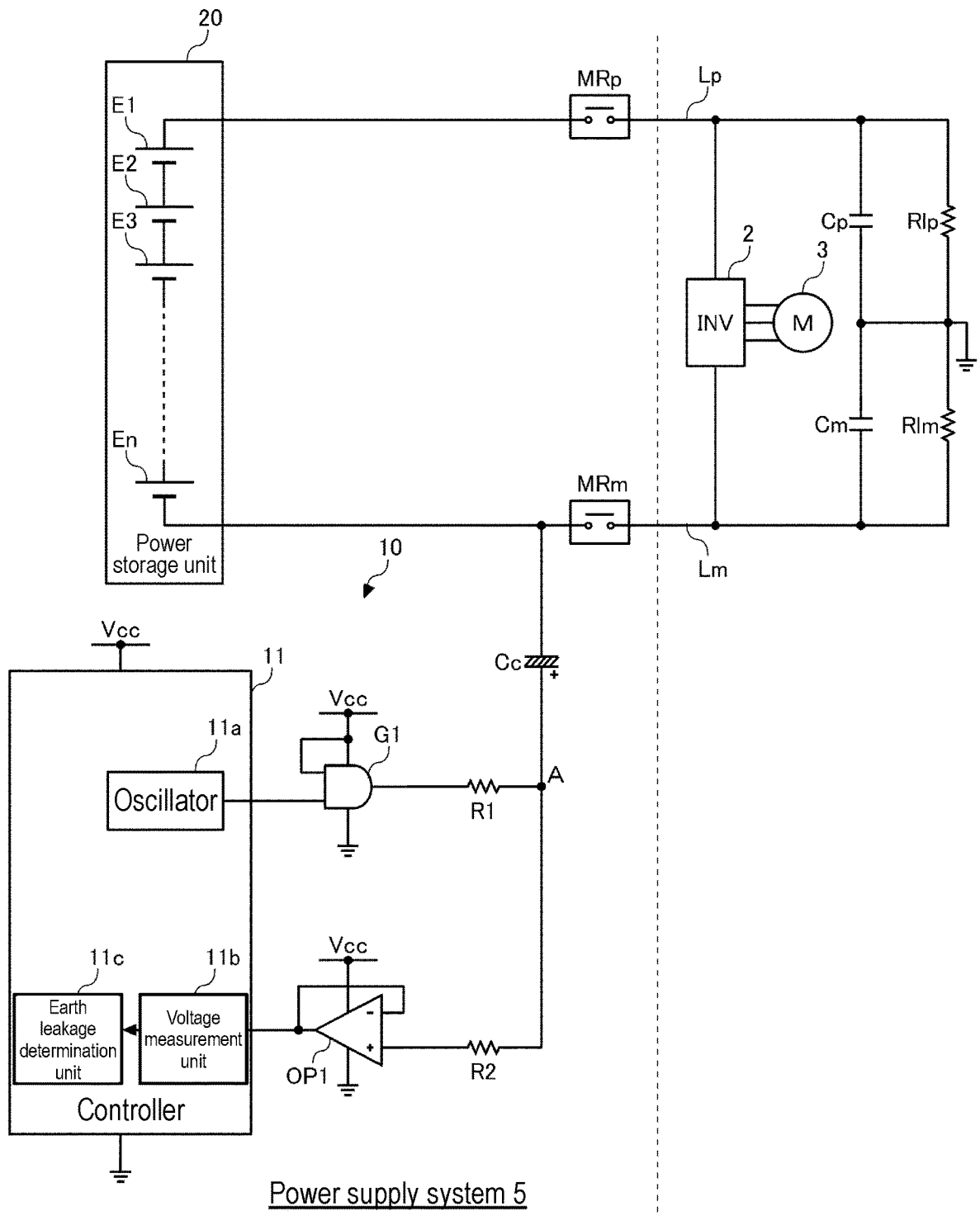
FIG. 1 is a diagram for describing a configuration of a power supply system including an earth leakage detection device according to a comparative example.

FIG. 1 is a diagram for describing a configuration of power supply system 5 including earth leakage detection device 10 according to a comparative example. Power supply system 5 is mounted on an electrically operated vehicle. Power supply system 5 is provided separately from an auxiliary battery (typically, a lead battery having an output of 12 V being used) in the electrically operated vehicle. Power supply system 5 includes high-voltage power storage unit 20 and earth leakage detection device 10. Power storage unit 20 includes a plurality of cells E1 to En connected in series. As the cell, a lithium ion battery cell, a nickel hydride battery, a lead battery cell, an electric double layer capacitor cell, a lithium ion capacitor cell, or the like can be used. Hereinafter, an example using a lithium ion battery cell (nominal voltage: 3.6 V to 3.7 V) is assumed in the present description.

An electrically operated vehicle includes inverter 2 and motor 3 as high-voltage loads. A positive electrode of power storage unit 20 and one end of inverter 2 are connected to each other by positive wire Lp, and a negative electrode of power storage unit 20 and the other end of inverter 2 are connected to each other by negative wire Lm. Positive-side main relay MRp is inserted into positive wire Lp, and negative-side main relay MRm is inserted into negative wire Lm. Positive-side main relay MRp and negative-side main relay MRm function as contactors that control conduction/disconnection between power storage unit 20 and high-voltage loads in the electrically operated vehicle. Note that, in place of these relays, semiconductor switches having a high withstand voltage and high insulation can be also used.

Inverter 2 is a bidirectional inverter that is connected between power storage unit 20 and motor 3. At the time of power running, inverter 2 converts DC power supplied from power storage unit 20 into AC power and supplies the AC power to motor 3. At the time of regeneration, inverter 2 converts AC power supplied from motor 3 into DC power and supplies the DC power to power storage unit 20. For example, a three-phase AC motor is used as motor 3. Motor 3 rotates corresponding to AC power supplied from inverter 2 at the time of power running. At the time of regeneration, rotational energy generated by deceleration is converted into AC power and the AC power is supplied to inverter 2.

Power storage unit 20 is mounted on the electrically operated vehicle in a state where power storage unit 20 is insulated from a chassis ground of the electrically operated vehicle. An auxiliary battery is mounted on the electrically operated vehicle in a state where the negative electrode is electrically conductive with the chassis ground. Note that positive wire Lp closer to inverter 2 with respect to positive-side main relay MRp and the chassis ground are connected to each other via positive-side Y capacitor Cp. In addition, negative wire Lm closer to inverter 2 with respect to negative-side main relay MRm and the chassis ground are connected to each other via negative-side Y capacitor Cm. Positive-side Y capacitor Cp has a function of galvanically insulating positive wire Lp and the chassis ground from each other and a function of stabilizing a voltage of positive wire Lp. Negative-side Y capacitor Cm has a function of galvanically insulating negative wire Lm and the chassis ground from each other and a function of stabilizing a voltage of negative wire Lm.

When power storage unit 20 is ideally insulated from the chassis ground, an intermediate potential of power storage unit 20 is maintained around a potential of the chassis ground. For example, when a voltage across terminals of power storage unit 20 is 250 V, a positive electrode potential of power storage unit 20 is maintained around +125 V, and a negative electrode potential is maintained around −125 V. When a human touches an exposed conducting part of the electrically operated vehicle in a state where high-voltage power storage unit 20 and the chassis ground are electrically conductive with each other, there is a risk that the human receives an electric shock. In view of the above, in the electrically operated vehicle on which high-voltage power storage unit 20 is mounted, it is necessary to mount earth leakage detection device 10 on the electrically operated vehicle so as to monitor an insulation state between a current path of high-voltage power storage unit 20 connected with a vehicle load and the chassis ground. In FIG. 1, an insulation state between positive wire Lp and the chassis ground is expressed as positive-side earth leakage resistance R1p, and an insulation state between negative wire Lm and the chassis ground is expressed as negative-side earth leakage resistance R1m.

In the comparative example, earth leakage detection device 10 includes coupling capacitor Cc, first resistor R1, AND gate G1, second resistor R2, first operational amplifier OP1, and controller 11. Controller 11 includes oscillator 11a, voltage measurement unit 11b, and earth leakage determination unit 11c. Controller 11 may include, for example, a microcomputer and a nonvolatile memory (for example, an electrically erasable programmable read-only memory (EEPROM) or a flash memory).

One end of coupling capacitor Cc is connected to a current path of power storage unit 20. In the example illustrated in FIG. 1, one end of coupling capacitor Cc is connected to the negative electrode of power storage unit 20. Note that one end of coupling capacitor Cc may be connected to the positive electrode of power storage unit 20, or may be connected to a node of any of a plurality of cells E1 to En in power storage unit 20. The other end of coupling capacitor Cc is connected to an output end of the voltage output unit via first resistor R1. A node between the other end of coupling capacitor Cc and first resistor R1 is measurement point A. Note that, in place of first resistor R1, another impedance element may be used.

In FIG. 1, as coupling capacitor Cc, an aluminum electrolytic capacitor capable of increasing a capacity at a relatively low cost is used. The aluminum electrolytic capacitor has polarity. In FIG. 1, a positive electrode of the aluminum electrolytic capacitor is connected to measurement point A, and a negative electrode of the aluminum electrolytic capacitor is connected to the negative electrode of power storage unit 20. Coupling capacitor Cc may be configured by connecting a plurality of aluminum electrolytic capacitors in series. In this case, even if a short-circuit failure occurs in one capacitor, DC-like insulation can be maintained by the remaining capacitors.

The voltage output unit generates a periodically changing periodic voltage, and applies the generated periodic voltage to the other end of coupling capacitor Cc via first resistor R1. Hereinafter, an example in which a rectangular wave voltage is used as the periodic voltage is assumed in the present description.

The voltage output unit includes oscillator 11a and gate G1. Oscillator 11a includes a multivibrator or a local oscillator, and generates a rectangular wave having a preset frequency. The rectangular wave voltage generated by oscillator 11a is input to a first input terminal of AND gate G1. A second input terminal of AND gate G1 is connected to power source potential Vcc. AND gate G1 outputs a high level (power source potential Vcc) when the rectangular wave voltage input to the first input terminal is at a high level, and outputs a low level (ground electric potential) when the rectangular wave voltage input to the first input terminal is at a low level. The ground electric potential is connected to the chassis ground. Hereinafter, an example in which power source potential Vcc is 5 V, and the ground electric potential is 0 V will be assumed.

AND gate G1 functions as a buffer that separates controller 11 and measurement point A. AND gate G1 is an example of a buffer. For example, an OR gate or a voltage follower may be used instead of the AND gate. When the OR gate is used, the ground electric potential is connected to the second input terminal of the OR gate.

Measurement point A is connected to a non-inverting input terminal of first operational amplifier OP1 via second resistor R2. An inverting input terminal and an output terminal of first operational amplifier OP1 are connected. First operational amplifier OP1 functions as a voltage follower that performs only impedance conversion with an amplification factor of one time. First operational amplifier OP1 outputs the voltage at measurement point A to voltage measurement unit 11b.

Voltage measurement unit 11b measures a voltage at measurement point A. Voltage measurement unit 11b includes an A/D converter, and the A/D converter samples the analog voltage at measurement point A at timing synchronized with the timing of the rising edge and the falling edge of the rectangular wave voltage generated by oscillator 11a, and converts the sampled analog voltage into a digital value. The voltage sampled at the timing of the rising edge of the rectangular wave voltage corresponds to the lower peak value of the measured voltage waveform, and the voltage sampled at the timing of the falling edge of the rectangular wave voltage corresponds to the upper peak value of the measured voltage waveform. Note that, in consideration of the blunting of the rectangular wave voltage, the timing at which the lower peak value should be sampled and the timing at which the upper peak value should be sampled may be adjusted. The A/D converter outputs a digital value obtained by converting the analog voltage at measurement point A to earth leakage determination unit 11c.

Earth leakage determination unit 11c determines the presence or absence of an earth leakage between the current path of power storage unit 20 and the chassis ground based on the voltage at measurement point A measured by voltage measurement unit 11b. When a peak-to-peak value indicated by the difference between the upper peak value and the lower peak value is smaller than a set value, earth leakage determination unit 11c determines that an earth leakage occurs between the current path of power storage unit 20 and the chassis ground. The set value is determined based on a peak-to-peak value of a measured voltage waveform at the time of occurrence of the earth leakage derived in advance by an experiment or simulation carried out by a designer. When an earth leakage occurs between the current path of power storage unit 20 and the chassis ground, an AC current flows from AND gate G1 to coupling capacitor Cc via first resistor R1 acting as a detection resistor. When the current flows through first resistor R1, the voltage amplitude at measurement point A decreases due to the voltage drop.

Figure 2:
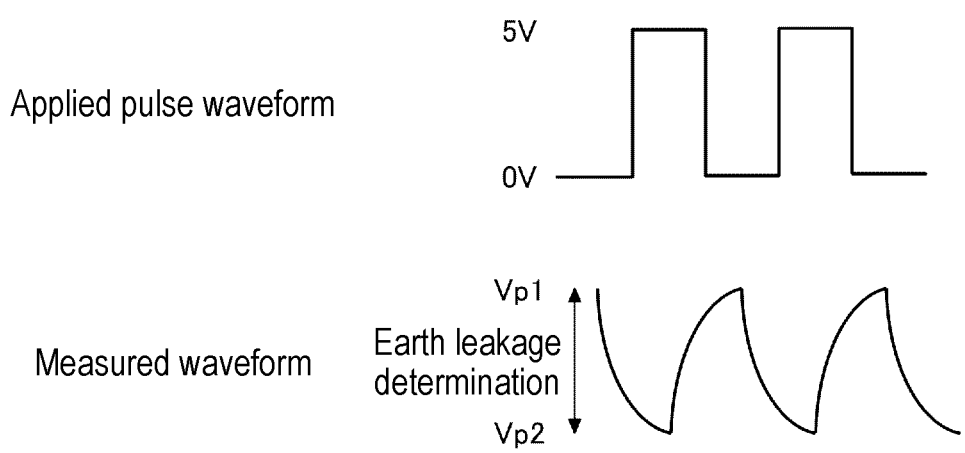
FIG. 2 is a diagram showing an example of an applied pulse waveform and a measured voltage waveform in the comparative example.

FIG. 2 is a diagram illustrating an example of an applied pulse waveform and a measured voltage waveform in a comparative example. In the pulse waveform applied from the voltage output unit to measurement point A, the high-side potential is set to 5 V, and the low-side potential is set to 0 V. Earth leakage determination unit 11c specifies upper peak value Vp1 and lower peak value Vp2 of the voltage waveform measured during the period in which the pulse voltage is applied to measurement point A, and determines the presence or absence of the earth leakage based on the peak-to-peak value defined by the difference between upper peak value Vp1 and lower peak value Vp2.

First Exemplary Embodiment

Figure 3:
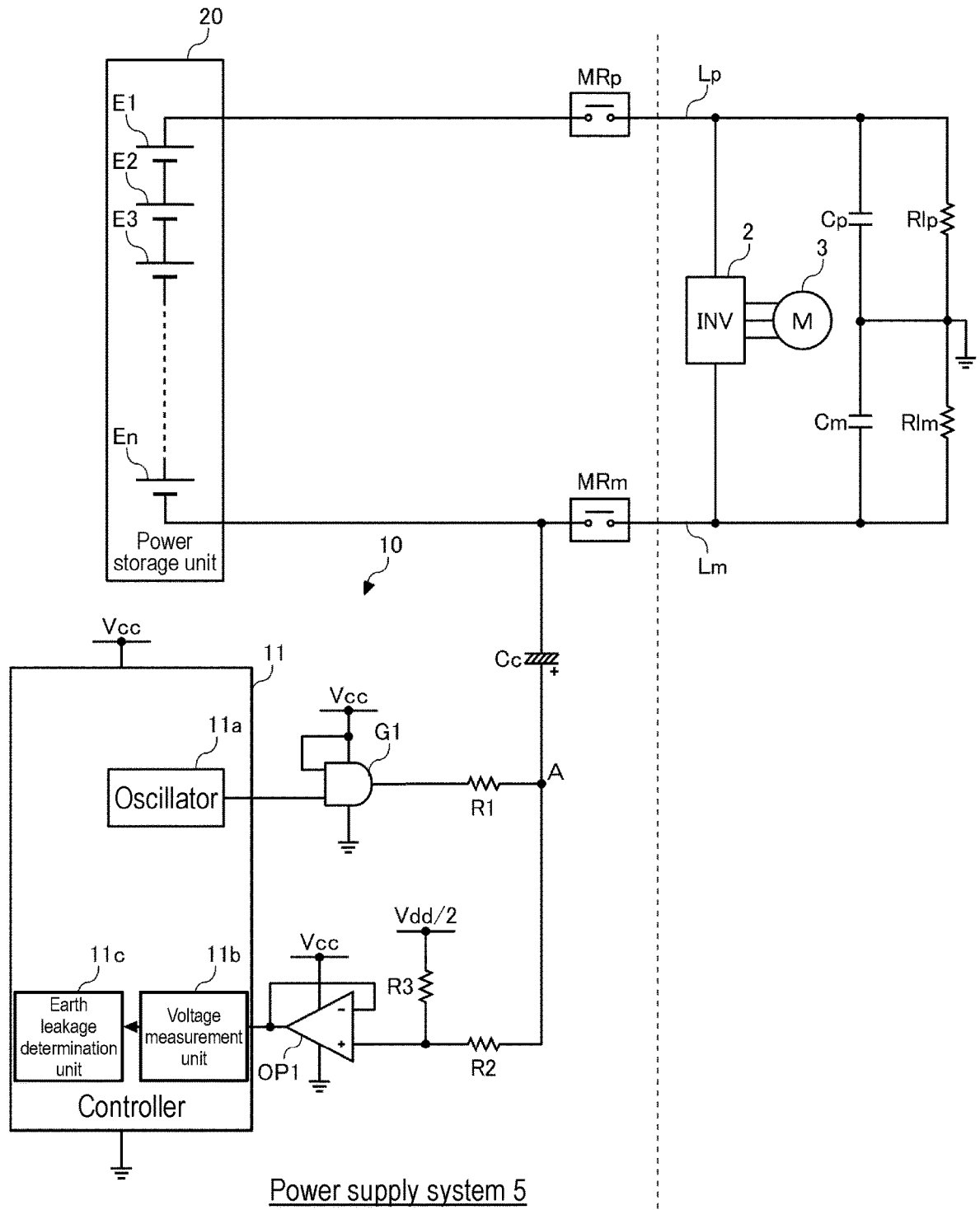
FIG. 3 is a diagram for describing a configuration of a power supply system including an earth leakage detection device according to a first exemplary embodiment.

FIG. 3 is a diagram for describing a configuration of power supply system 5 including earth leakage detection device 10 according to a first exemplary embodiment. Hereinafter, differences from the configuration of power supply system 5 according to the comparative example illustrated in FIG. 1 will be described. In the first exemplary embodiment, third resistor R3 is connected between a node between second resistor R2 and a non-inverting input terminal of first operational amplifier OP1 and a predetermined fixed potential. That is, second resistor R2 and third resistor R3 are connected in series between measurement point A and the fixed potential. A voltage at a voltage dividing point between second resistor R2 and third resistor R3 is input to the non-inverting input terminal of first operational amplifier OP1. That is, voltage measurement unit 11b measures the voltage at the voltage dividing point between second resistor R2 and third resistor R3.

The fixed potential is set to an intermediate potential in an input voltage range of first operational amplifier OP1 that defines a measurement range of voltage measurement unit 11b. In the first exemplary embodiment, since the input voltage range of first operational amplifier OP1 is in the range of 0 V to 5 V, the fixed potential is set to 2.5 V.

In the first exemplary embodiment, since the relationship between the resistance value of third resistor R3 and the resistance value of second resistor R2 is set to 1:2, the voltage at the voltage dividing point between second resistor R2 and third resistor R3 is a voltage compressed to ⅓ of the voltage at measurement point A.

Earth leakage determination unit 11c calculates the earth leakage resistance value with reference to the earth leakage resistance conversion table based on the amplitude value of the voltage measured by voltage measurement unit 11b, and determines the presence or absence of an earth leakage between the current path of power storage unit 20 and the chassis ground.

When main relays MRp and MRm are turned on, the voltage of power storage unit 20 greatly fluctuates, and accordingly, a charging current flows from the voltage output unit to coupling capacitor Cc via first resistor R1. In this case, the voltage at measurement point A greatly decreases and greatly deviates below the measurement range (0 V to 5 V) of voltage measurement unit 11b. The voltage at measurement point A returns to the intermediate potential (2.5 V) as the charging current of coupling capacitor Cc decreases, and gets back to the intermediate potential (2.5 V) at the time point when the charging of coupling capacitor Cc is completed. When earth leakage resistance R1p is large, it may take 30 seconds or more for the entire voltage waveform at measurement point A to enter the measurement range (0 V to 5 V).

Figure 4:
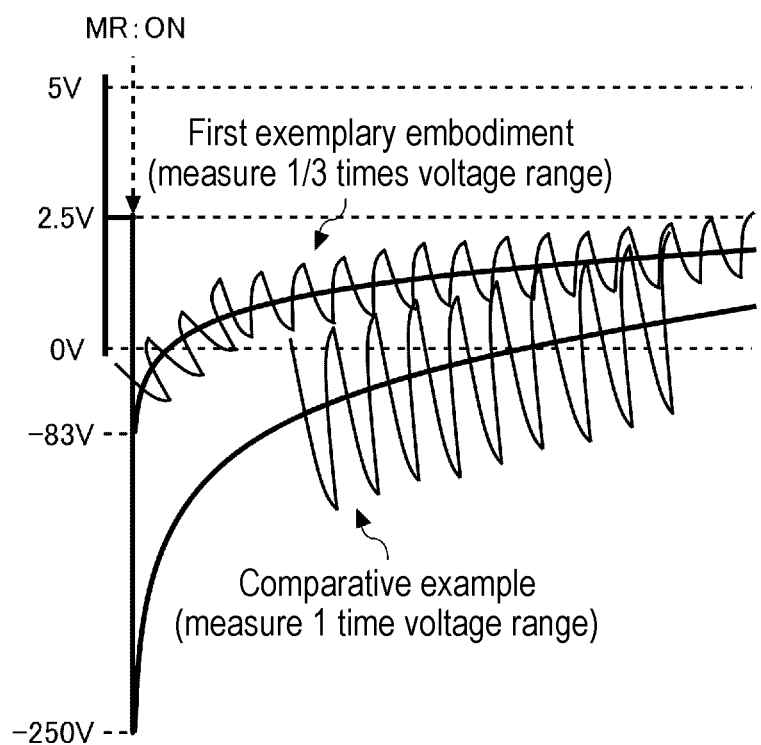

FIG. 4 is a diagram illustrating an example of measured voltage waveforms when main relays MRp and MRm are turned on. In the comparative example, the voltage at measurement point A is measured as it is. In the example illustrated in FIG. 4, the measured voltage decreases to around −250 V as main relays MRp and MRm are turned on. On the other hand, in the first exemplary embodiment, the voltage at measurement point A is compressed ⅓ times and measured. In the example illustrated in FIG. 4, the measured voltage decreases to around −83 V as main relays MRp and MRm are turned on. In either case, the measured voltage appears to be stuck to the lower limit (0 V) in voltage measurement unit 11b.

In order to determine an earth leakage, it is necessary to calculate a peak-to-peak value, so that the entire amplitude of the voltage input to voltage measurement unit 11b needs to fall within the measurement range (0 V to 5 V). When the measured voltage waveform according to the comparative example is compared with the measured voltage waveform according to the first exemplary embodiment, it can be seen that the time until the measured voltage waveform falls within the measurement range (0 V to 5 V) is significantly shortened in the latter case.

Note that the voltage at measurement point A may deviate above the measurement range. When main relays MRp and MRm are turned on or off in a state where coupling capacitor Cc is charged for some reason, a discharge current flows from coupling capacitor Cc toward the voltage output unit via first resistor R1. In this case, the voltage at measurement point A greatly increases and greatly deviates above the measurement range. In this case as well, in the first exemplary embodiment, it is possible to significantly shorten the time until the voltage falls within the measurement range.

As described above, according to the first exemplary embodiment, the voltage at measurement point A is divided and measured, so that the period during which the voltage at measurement point A deviates from the measurement range can be shortened. As a result, it is possible to reduce the period during which the earth leakage determination cannot be performed, and it is possible to improve safety. In addition, since it is not necessary to provide a band-pass filter or a high-pass filter in a preceding stage of voltage measurement unit 11b, it is possible to suppress an increase in circuit scale and an increase in cost.

Second Exemplary Embodiment

Figure 5:
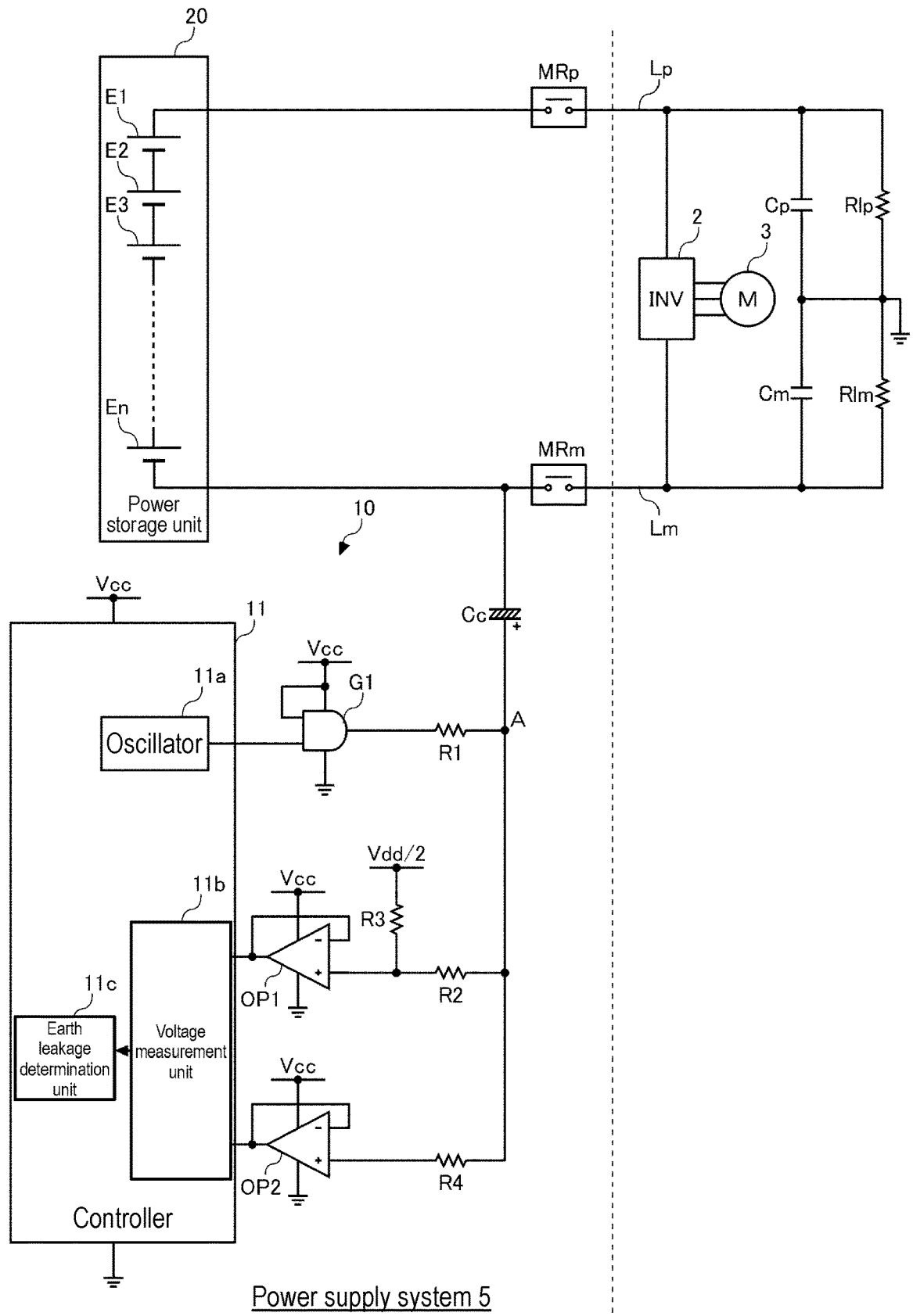
FIG. 5 is a diagram for describing a configuration of a power supply system including an earth leakage detection device according to a second exemplary embodiment.

FIG. 5 is a diagram for describing a configuration of power supply system 5 including earth leakage detection device 10 according to a second exemplary embodiment. Hereinafter, differences from the configuration of power supply system 5 according to the first exemplary embodiment illustrated in FIG. 3 will be described. In the first exemplary embodiment, the example in which the voltage at measurement point A is divided to ⅓ has been described. In this case, the amplitude of the voltage input to voltage measurement unit 11b becomes ⅓. When the amplitude becomes ⅓, the influence of the measurement error of the A/D converter in voltage measurement unit 11b becomes 3 times. As described above, the securing of the measurable time by the compression of the measured voltage and the detection accuracy are in a trade-off relationship. That is, the detection accuracy decreases as the compression rate is increased to secure a longer measurable time, and the decrease in the detection accuracy can be suppressed as the compression rate is decreased.

In the second exemplary embodiment, a voltage acquisition unit that compresses the measured voltage and a voltage acquisition unit that does not compress the measured voltage are provided together. Specifically, fourth resistor R4 and second operational amplifier OP2 are added to the configuration of power supply system 5 according to the first exemplary embodiment illustrated in FIG. 3. Fourth resistor R4 and second operational amplifier OP2 illustrated in FIG. 5 correspond to second resistor R2 and first operational amplifier OP1 illustrated in FIG. 1.

When the entire amplitude of the voltage restored according to the voltage dividing ratio between second resistor R2 and third resistor R3 falls within the measurement range based on the voltage input from the voltage acquisition unit that compresses the measured voltage, earth leakage determination unit 11c determines the presence or absence of the earth leakage based on the amplitude value of the measured voltage of the voltage input from the voltage acquisition unit that does not compress the measured voltage. When the entire amplitude of the restored voltage does not fall within the measurement range, earth leakage determination unit 11c calculates the earth leakage resistance value with reference to the earth leakage resistance conversion table based on the amplitude value of the voltage input from the voltage acquisition unit that compresses the measured voltage, and determines the presence or absence of the earth leakage.

As described above, according to the second exemplary embodiment, it is possible to shorten the period during which the voltage at measurement point A deviates from the measurement range while reducing the period during which the detection accuracy decreases.

Third Exemplary Embodiment

Figure 6:
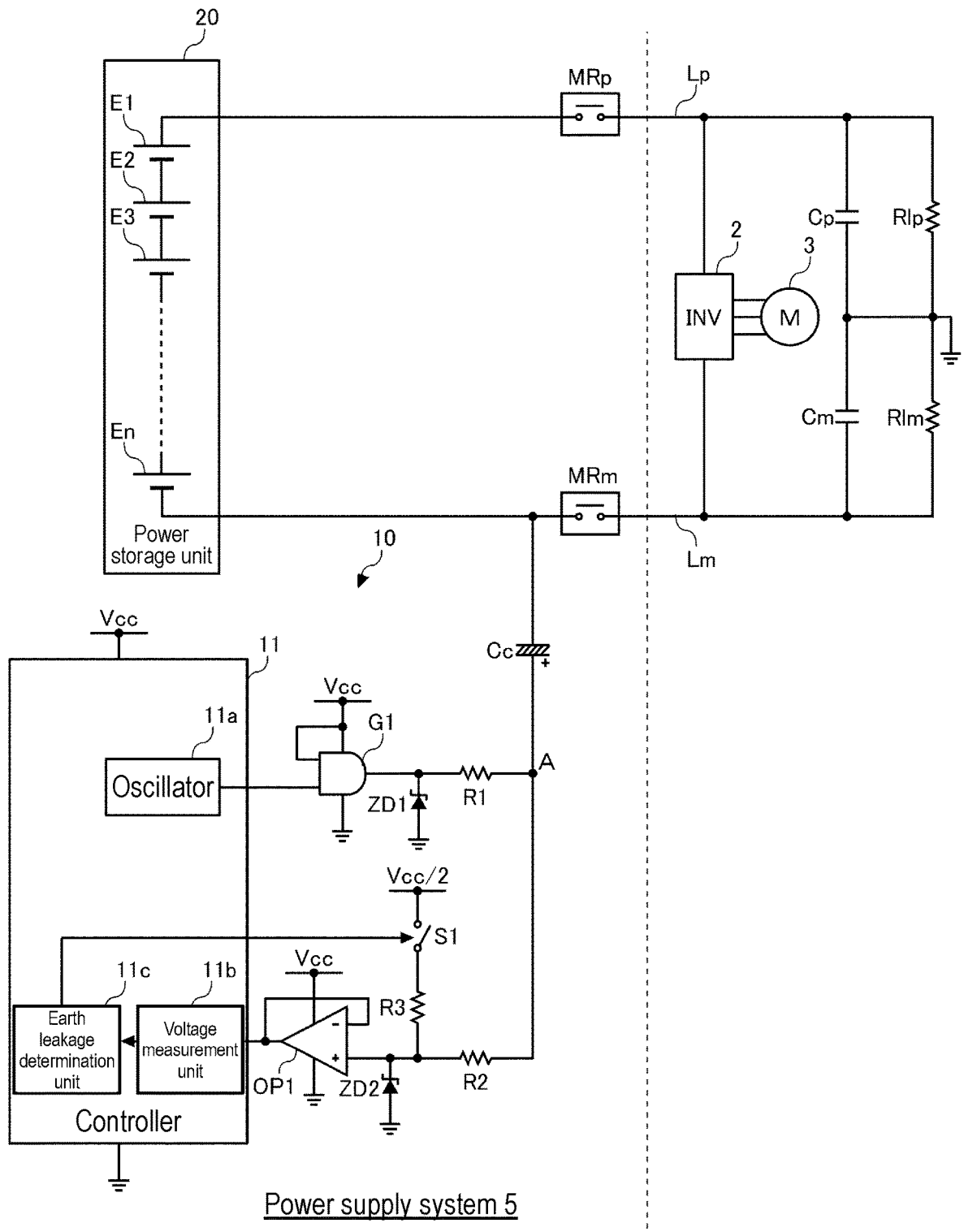
FIG. 6 is a diagram for describing a configuration of a power supply system including an earth leakage detection device according to a third exemplary embodiment.

FIG. 6 is a diagram for describing a configuration of power supply system 5 including earth leakage detection device 10 according to a third exemplary embodiment. Hereinafter, differences from the configuration of power supply system 5 according to the first exemplary embodiment illustrated in FIG. 3 will be described. In the third exemplary embodiment, first switch S1 is connected between fixed potential Vcc/2 and third resistor R3. A semiconductor switch can be used as first switch S1.

In the ON state of first switch S1, earth leakage determination unit 11c multiplies the voltage measured by voltage measurement unit 11b by a magnification corresponding to the resistance voltage dividing ratio to restore the voltage before compression. Earth leakage determination unit 11c turns off the first switch when the entire amplitude of the restored voltage falls within the measurement range of voltage measurement unit 11b. Earth leakage determination unit 11c uses the voltage measured by voltage measurement unit 11b as it is as the measured voltage in the off state of first switch S1. When the entire amplitude of the measured voltage does not fall within the measurement range of voltage measurement unit 11b in the off state of first switch S1, earth leakage determination unit 11c turns on the first switch.

As described above, according to the third exemplary embodiment, a similar effect to that of the second exemplary embodiment is exhibited. Note that, in FIG. 6, first zener diode ZD1 and second zener diode ZD2 are illustrated. First zener diode ZD1 is connected between a node between the output terminal of AND gate G1 and first resistor R1 and the chassis ground. Second zener diode ZD2 is connected between a node between a non-inverting input terminal of first operational amplifier OP1 and second resistor R2 and the chassis ground. First zener diode ZD1 and second zener diode ZD2 prevent an overvoltage from being applied to AND gate G1 or first operational amplifier OP1 due to opening or closing of main relay MRp or MRm or the fluctuation of a load of power supply system 5.

Although not illustrated in FIGS. 1, 3, and 5, actually, first zener diode ZD1 and second zener diode ZD2 are generally installed. In a case where second zener diode ZD2 is installed in the configuration illustrated in FIG. 5, when the potential at measurement point A becomes lower than the potential of the chassis ground, second zener diode ZD2 is conducted, and a current flows from the chassis ground to measurement point A via second zener diode ZD2. In this case, the potential at measurement point A becomes unstable, and the detection accuracy of the measured voltage decreases. In the third exemplary embodiment, the influence at the time of conduction of second zener diode ZD2 can be alleviated.

Fourth Exemplary Embodiment

Figure 7:
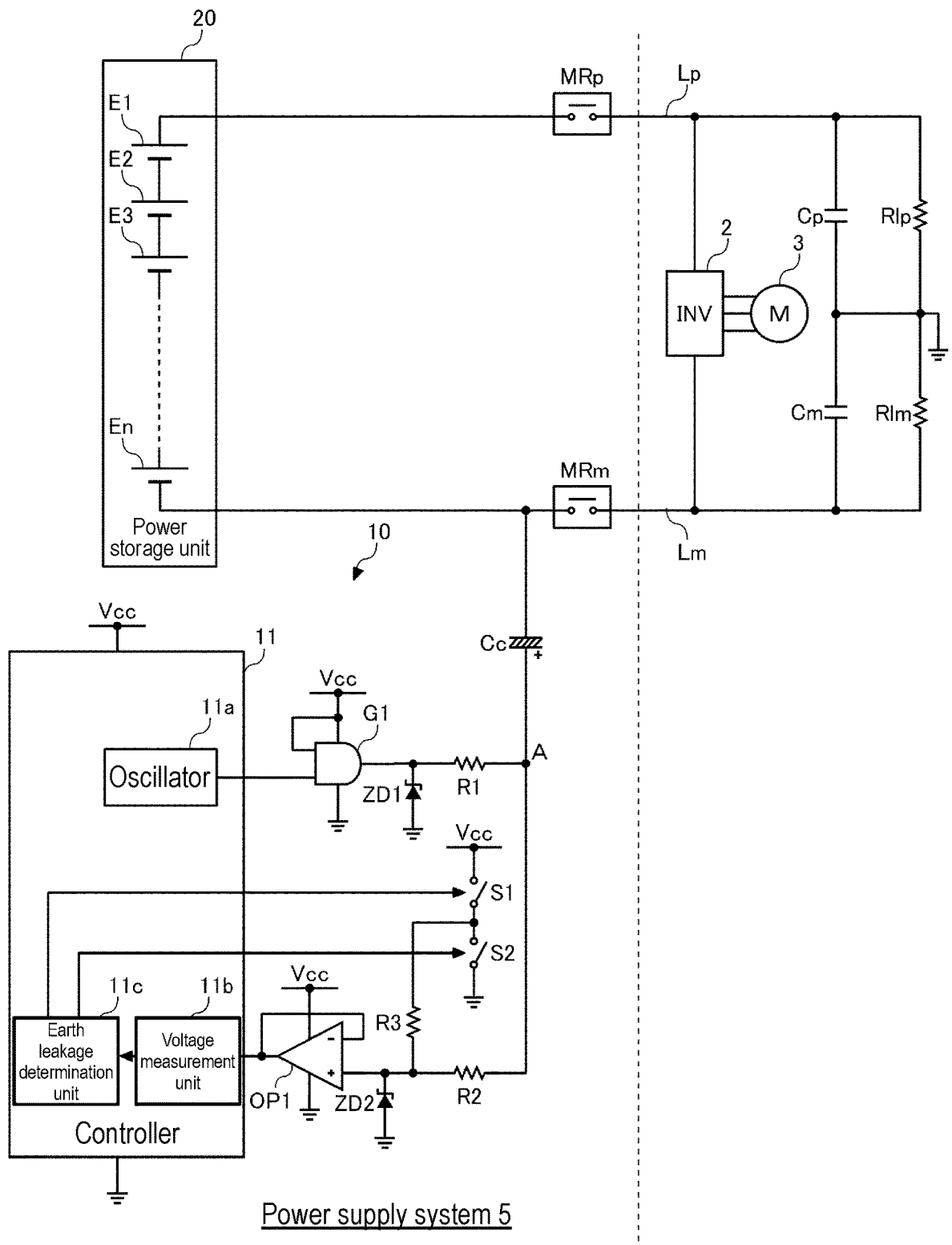
FIG. 7 is a diagram for describing a configuration of a power supply system including an earth leakage detection device according to a fourth exemplary embodiment.

FIG. 7 is a diagram for describing a configuration of power supply system 5 including earth leakage detection device 10 according to a fourth exemplary embodiment. Hereinafter, differences from the configuration of power supply system 5 according to the third exemplary embodiment illustrated in FIG. 6 will be described. In the fourth exemplary embodiment, the potential of the fixed potential connected to one end of third resistor R3 can be switched.

First switch S1 and second switch S2 are connected in series between a first fixed potential set to the upper limit potential (5 V) of the measurement range (0 to 5 V) of voltage measurement unit 11b and a second fixed potential set to the lower limit potential (0 V). A semiconductor switch can be used as first switch S1 and second switch S2. For example, a P-channel metal oxide semiconductor field effect transistor (MOSFET) may be used as first switch S1, and an N-channel MOSFET may be used as second switch S2.

A node between first switch S1 and second switch S2 is connected to a terminal of third resistor R3 on a side not connected to second resistor R2. In the fourth exemplary embodiment, since the resistance value of third resistor R3 and the resistance value of second resistor R2 are set to be the same, the voltage dividing ratio between second resistor R2 and third resistor R3 is 1:1. That is, the voltage at the voltage dividing point between second resistor R2 and third resistor R3 is a voltage compressed to ½ of the voltage at measurement point A.

When the measured voltage sticks to the upper limit of the measurement range of voltage measurement unit 11b, earth leakage determination unit 11c controls first switch S1 to be in the OFF state and second switch S2 to be in the ON state. When the measured voltage sticks to the lower limit of the measurement range of voltage measurement unit 11b, earth leakage determination unit 11c controls first switch S1 to be in the ON state and second switch S2 to be in the OFF state.

When one of first switch S1 and second switch S2 is in the on state and the other is in the off state, earth leakage determination unit 11c may control both first switch S1 and second switch S2 to be in the off state when the entire amplitude of the measured voltage falls within the measurement range of voltage measurement unit 11b. Even in this state, when the entire amplitude of the measured voltage falls within the measurement range of voltage measurement unit 11b, earth leakage determination unit 11c maintains this state. In a case where the entire amplitude of the measured voltage does not fall within the measurement range of voltage measurement unit 11b in a state where both first switch S1 and second switch S2 are off, earth leakage determination unit 11c returns to the original state. Note that, without providing first switch S1 and second switch S2, the upper limit potential (5 V) or the lower limit potential (0 V) may be applied from the output port of controller 11 to the other end of third resistor R3.

Figure 8:
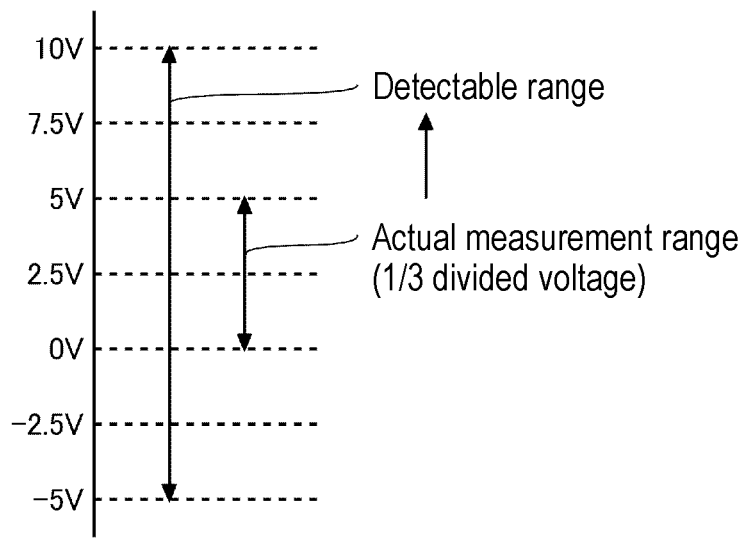
FIGS. 8(*a*) and 8(*b*) illustrate diagrams for describing a difference in measured voltage compression system between the first to third exemplary embodiments and the fourth exemplary embodiment.
Figure 8:
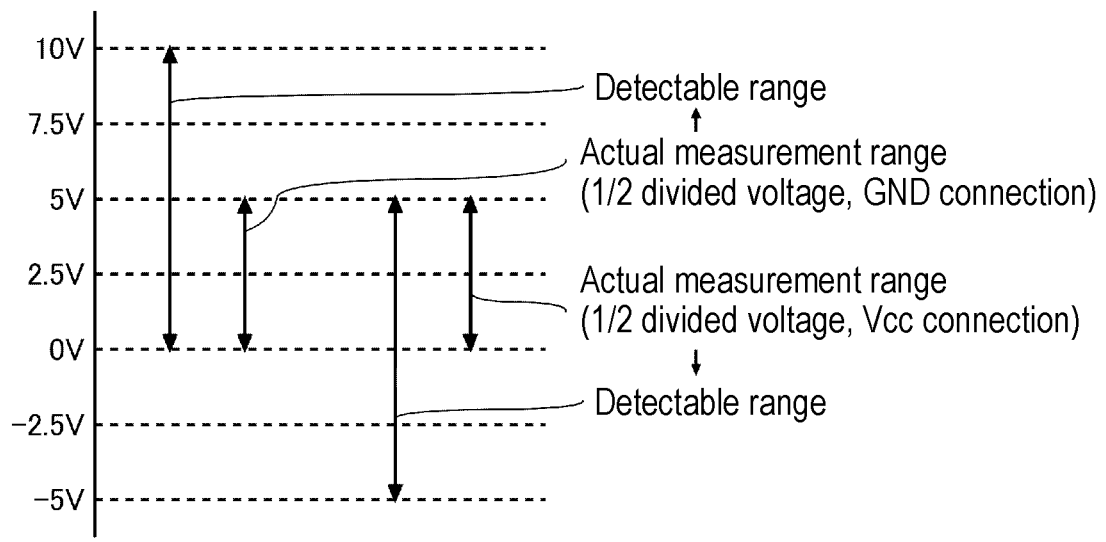

FIGS. 8(a) and 8(b) illustrates diagrams for describing a difference in compression system of the measured voltage between the first to third exemplary embodiments and the fourth exemplary embodiment. The examples illustrated in FIGS. 8(a) and 8(b) illustrate a compression system for enabling detection of the voltage at measurement point A in the range of −5 V to +10 V. All of the actual measurement ranges by voltage measurement unit 11b are in the range of 0 V to +5 V. FIG. 8(a) illustrates a compression system of the first to third exemplary embodiments. In the first to third exemplary embodiments, third resistor R3 is connected to Vcc/2 (2.5 V). Since the voltage dividing ratio between second resistor R2 and third resistor R3 is 2:1, a voltage in the range of −5 V to +10 V can be detected from a voltage in the range of 0 V to +5 V.

FIG. 8(b) illustrates a compression system of the fourth exemplary embodiment. In the fourth exemplary embodiment, when the measured voltage waveform is on the upper side of the diagram, third resistor R3 is connected to GND (0 V). Since the voltage dividing ratio between second resistor R2 and third resistor R3 is 1:1, a voltage in the range of 0 V to +10 V can be detected from a voltage in the range of 0 V to +5 V. When the measured voltage waveform is on the lower side of the diagram, third resistor R3 is connected to Vcc (5 V). Since the voltage dividing ratio between second resistor R2 and third resistor R3 is 1:1, a voltage in the range of −5 V to +5 V can be detected from a voltage in the range of 0 V to +5 V. When both are combined, a voltage in a range of −5 V to +10 V can be detected from a voltage in a range of 0 V to +5 V.

As described above, according to the fourth exemplary embodiment, a similar effect to that of the first to third exemplary embodiments is exhibited. Further, in the fourth exemplary embodiment, since the compression rate of the measured voltage is suppressed to ½, the degradation of the detection accuracy can be suppressed as compared with the first to third exemplary embodiments.

The present disclosure is described above according to the exemplary embodiments. It will be understood by those skilled in the art that the exemplary embodiments are merely an example, other modified examples in which components and processes of the exemplary embodiments are variously combined are possible, and the other modified examples still fall within the scope of the present disclosure.

In the above-described first to third exemplary embodiments, the example has been described in which the voltage dividing ratio between second resistor R2 and third resistor R3 is 2:1, and in the fourth exemplary embodiment, the voltage dividing ratio between second resistor R2 and third resistor R3 is 1:1. In this regard, the voltage dividing ratio between second resistor R2 and third resistor R3 is not limited to these values, and the designer can arbitrarily set the voltage dividing ratio while considering the trade-off relationship.

In the above-described first to fourth exemplary embodiments, the example in which the rectangular wave voltage is applied from the voltage output unit to coupling capacitor Cc via first resistor R1 has been described. In this regard, a sinusoidal voltage may be applied to coupling capacitor Cc. Also in this case, earth leakage determination unit 11c can specify the peak-to-peak value from the voltage waveform at measurement point A and determine the presence or absence of the earth leakage as in the first to fourth exemplary embodiments.

In the above-described first to fourth exemplary embodiments, a description has been given to an example in which earth leakage detection device 10 is mounted on the electrically operated vehicle and used. In this regard, earth leakage detection device 10 according to the first to fourth exemplary embodiments can also be applied to applications other than in-vehicle applications. The load may be any load as long as power storage unit 20 and the load that receives power supply from power storage unit 20 are insulated from the ground. For example, the load may be a load used in a railway vehicle.

Note that, the exemplary embodiments may be specified by the following items.

[Item 1]

Earth leakage detection device (10), including:
  coupling capacitor (Cc) having one end connected to a current path of power storage unit (20) connected to load (2) in a state of being insulated from a ground;
  voltage output unit (11a, G1) that generates a periodically changing periodic voltage and applies the periodic voltage to another end of coupling capacitor (Cc) via first resistor (R1);

second resistor (R2) and third resistor (R3) connected in series between a node between coupling capacitor (Cc) and first resistor (R1) and a predetermined fixed potential;

voltage measurement unit (11b) that measures a voltage at a voltage dividing point between second resistor (R2) and third resistor (R3); and earth leakage determination unit (11c) that determines presence or absence of an earth leakage between the current path of power storage unit (20) and the ground based on the voltage measured by voltage measurement unit (11b).

According to this, it is possible to shorten the period during which the voltage at the measurement point deviates from the measurement range.

[Item 2]

Earth leakage detection device (10) according to item 1, wherein the fixed potential is set to an intermediate potential of a measurement range of voltage measurement unit (11b), and a voltage dividing ratio between second resistor (R2) and third resistor (R3) is set according to a ratio between a measurement range of voltage measurement unit (11b) and a voltage range to be detected.

According to this, it is possible to compress the voltage at the measurement point at an arbitrary compression rate.

[Item 3]

Earth leakage detection device (10) according to item 1 or 2, further including switch (S1) connected between third resistor (R3) and the fixed potential, wherein earth leakage determination unit (11c) turns off switch (S1) when an entire amplitude of the voltage restored according to the voltage dividing ratio between second resistor (R2) and third resistor (R3) falls within the measurement range of voltage measurement unit (11b) in an on state of switch (S1).

According to this, it is possible to shorten the period during which the detection accuracy decreases due to compression.

[Item 4]

Earth leakage detection device (10) according to item 1, wherein a first fixed potential set to an upper limit potential of a measurement range of voltage measurement unit (11b) and a second fixed potential set to a lower limit potential are applicable to a terminal of third resistor (R3) on a side not connected to second resistor (R2), and earth leakage determination unit (11c) applies the second fixed potential to the terminal when a measured voltage sticks to an upper limit of the measurement range, and applies the first fixed potential to the terminal when the measured voltage sticks to a lower limit of the measurement range.

According to this, it is possible to suppress the reduction in the detection accuracy by suppressing the compression rate.

[Item 5]

Vehicular power supply system (5), including:

power storage unit (20) that is mounted in a state of being insulated from a chassis ground of a vehicle and supplies power to load (2) in the vehicle; and earth leakage detection device (10) according to any one of items 1 to 4.

According to this, it is possible to achieve vehicular power supply system (5) including earth leakage detection device (10) in which the period during which the voltage at the measurement point deviates from the measurement range is shortened.

REFERENCE MARKS IN THE DRAWINGS 2 inverter
3 motor
Lp positive wire
Lm negative wire
Cp positive-side Y capacitor
Cm negative-side Y capacitor
C1 smoothing capacitor
R1p positive-side earth leakage resistance
R1m negative-side earth leakage resistance
5 power supply system
20 power storage unit
E1 to En cell
10 earth leakage detection device
11 controller
11a oscillator
11b voltage measurement unit
11c earth leakage determination unit
Cc coupling capacitor
R1 first resistor
R2 second resistor
R3 third resistor
R4 fourth resistor
OP1 first operational amplifier
OP2 second operational amplifier
G1 AND gate
ZD1 first zener diode
ZD2 second zener diode
S1 first switch
S2 second switch

The invention claimed is:

1. An earth leakage detection device, comprising:

a coupling capacitor including one end connected to a current path of a power storage unit, the power storage unit being connected to a load in a state of being insulated from a ground;

a voltage output unit that generates a periodically changing periodic voltage and applies the periodically changing periodic voltage to another end of the coupling capacitor via a first resistor;

a second resistor and a third resistor connected in series between (i) a node between the coupling capacitor and the first resistor and (ii) a predetermined fixed potential;

a voltage measurement unit that measures a voltage at a voltage dividing point between the second resistor and the third resistor; and an earth leakage determination unit that determines whether or not a leakage occurs between the current path of the power storage unit and the ground based on the voltage measured by the voltage measurement unit.

2. The earth leakage detection device according to claim 1, wherein the fixed potential is set to an intermediate potential of a measurement range of the voltage measurement unit, and a voltage dividing ratio between the second resistor and the third resistor is set according to a ratio between a measurement range of the voltage measurement unit and a voltage range to be detected.

3. The earth leakage detection device according to claim 1, further comprising a switch connected between the third resistor and the fixed potential, wherein the earth leakage determination unit turns off the switch when an entire amplitude of the voltage restored according to the voltage dividing ratio between the second resistor and the third resistor falls within the measurement range of the voltage measurement unit in an on state of the switch.

4. The earth leakage detection device according to claim 1, wherein the earth leakage detection device includes a terminal of the third resistor configured to be applied a first fixed potential and a second fixed potential, the first fixed potential being set to an upper limit potential of a measurement range of the voltage measurement unit, and the second fixed potential being set to a lower limit potential, the terminal of the third resister not being connected to the second resistor, and the earth leakage determination unit applies the second fixed potential to the terminal when a measured voltage sticks to an upper limit of the measurement range, and applies the first fixed potential to the terminal when the measured voltage sticks to a lower limit of the measurement range.

5. A vehicular power supply system, comprising:

the earth leakage detecting device according to claim 1; and a power storage unit that is mounted in a vehicle in a state of being insulated from a chassis ground of the vehicle and supplies power to a load in the vehicle.

* * * * *